US011074147B2

(12) United States Patent
Bergmann et al.

(10) Patent No.: US 11,074,147 B2
(45) Date of Patent: Jul. 27, 2021

(54) CONTINUOUS MUTUAL EXTENDED PROCESSOR SELF-TEST

(71) Applicant: International Business Machines Corporation, Armonk, NY (US)

(72) Inventors: Tobias Ulrich Bergmann, Weinstadt (DE); Oliver Benke, Stuttgart (DE); Thomas Gentner, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 175 days.

(21) Appl. No.: 16/206,337

(22) Filed: Nov. 30, 2018

(65) Prior Publication Data

US 2020/0174901 A1    Jun. 4, 2020

(51) Int. Cl.
| | | |
|---|---|---|
| *G06F 11/22* | (2006.01) | |
| *G06F 11/27* | (2006.01) | |
| *G06F 1/3203* | (2019.01) | |
| *G01R 31/3185* | (2006.01) | |
| *G06F 11/273* | (2006.01) | |

(52) U.S. Cl.
CPC .. *G06F 11/2236* (2013.01); *G01R 31/318533* (2013.01); *G06F 1/3203* (2013.01); *G06F 11/27* (2013.01); *G06F 11/273* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,260,950 | A * | 11/1993 | Simpson | G01R 31/318555 324/73.1 |
| 5,491,788 | A * | 2/1996 | Cepulis | G06F 11/1417 714/13 |
| 6,249,893 | B1 * | 6/2001 | Rajsuman | G01R 31/318385 714/738 |
| 6,769,080 | B2 * | 7/2004 | Whetsei | G01R 31/31721 714/729 |
| 7,409,610 | B1 * | 8/2008 | Drimer | G01R 31/318544 326/39 |
| 7,483,824 | B1 | 1/2009 | Hill | |
| 7,558,984 | B2 * | 7/2009 | McGowan | G06F 11/2242 714/31 |

(Continued)

OTHER PUBLICATIONS

Hage et al.; "On Testing of Superscalar Processors in Functional Mode for Delay Faults"; IEEE Conference Publication; https://ieeexplore.ieee.org/document/7884810/; 4 Pages.

(Continued)

*Primary Examiner* — Amine Riad
(74) *Attorney, Agent, or Firm* — Cantor Colburn LLP; Margaret McNamara

(57) ABSTRACT

A method for a continuous mutual extended processor self-test is provided. The method is implemented by a system including a plurality of cores. The system sets an operating condition for the continuous mutual extended processor self-test. An assist processor of the plurality of cores executes a test program that implements the continuous mutual extended processor self-test on a core under test of the plurality of cores. The system determines a pattern and a response during the test program execution and repeats the test program until the test program has finished or failed.

14 Claims, 5 Drawing Sheets

(56) References Cited

U.S. PATENT DOCUMENTS

| | | | | |
|---|---|---|---|---|
| 7,793,125 | B2* | 9/2010 | Berry, Jr. | G06F 1/266 |
| | | | | 713/320 |
| 8,122,312 | B2* | 2/2012 | Floyd | G01R 31/31724 |
| | | | | 714/733 |
| 8,539,294 | B2* | 9/2013 | Saxena | G06F 1/3234 |
| | | | | 714/729 |
| 8,856,602 | B2 | 10/2014 | Brown et al. | |
| 9,182,445 | B2* | 11/2015 | Wong | G01R 31/318544 |
| 9,336,105 | B2* | 5/2016 | Riley | G06F 11/27 |
| 10,192,365 | B2* | 1/2019 | Siddiqui | G06T 7/73 |
| 2003/0115525 | A1* | 6/2003 | Hill | G01R 31/318547 |
| | | | | 714/726 |
| 2004/0003329 | A1* | 1/2004 | Cote | G01R 31/318563 |
| | | | | 714/726 |
| 2007/0162446 | A1* | 7/2007 | Appenzeller | G06F 11/2236 |
| 2010/0287429 | A1* | 11/2010 | Maruyama | G01R 31/318547 |
| | | | | 714/728 |
| 2015/0293173 | A1* | 10/2015 | Tsuboi | G06F 11/08 |
| | | | | 714/727 |
| 2017/0242781 | A1 | 8/2017 | Atzitz et al. | |
| 2017/0293541 | A1 | 10/2017 | Venu et al. | |
| 2017/0356959 | A1* | 12/2017 | Douskey | G01R 31/318563 |

OTHER PUBLICATIONS

Li et al.; "Operating System Scheduling for Efficient Online Self-Test in Robust Systems"; IEEE/ACM International Conference on Computer-Aided Design of Technical Papers; Nov. 2-5, 2009; pp. 201-208.

Sabena et al.; "On the Automatic Generation of Optimized Software-Based Self-Test Programs for VLIW Processors"; IEEE Journals & Magazine; vol. 22, Issue: 4; https://ieeexplore.ieee.org/abstract/document/6497676/; 4 Pages.

* cited by examiner

CONTINUOUS MUTUAL EXTENDED PROCESSOR SELF-TEST

BACKGROUND

The disclosure relates generally to processor testing, and more specifically, to continuous mutual extended processor self-test.

In general, extensive processor testing is done at the time of manufacturing only. Manufacturing testing uses special test equipment and is time intensive. Built-in self-tests (BISTs) can complement manufacturing testing by running testing subsets at processor startups. Yet, drawbacks of BISTs include higher power consumption during testing and possible performance degradations for the processors.

SUMMARY

According to one embodiment, a method for a continuous mutual extended processor self-test is provided. The method is implemented by a system including a plurality of cores. The system sets an operating condition for the continuous mutual extended processor self-test. An assist processor of the plurality of cores executes a test program that implements the continuous mutual extended processor self-test on a core under the test of the plurality of cores. The system determines a pattern and a response during the test program execution and repeats the test program until the test program has finished or failed.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter is particularly pointed out and distinctly claimed in the claims at the conclusion of the specification. The foregoing and other features, and advantages of the embodiments herein are apparent from the following detailed description taken in conjunction with the accompanying drawings in which:

DETAILED DESCRIPTION

Figure 1:
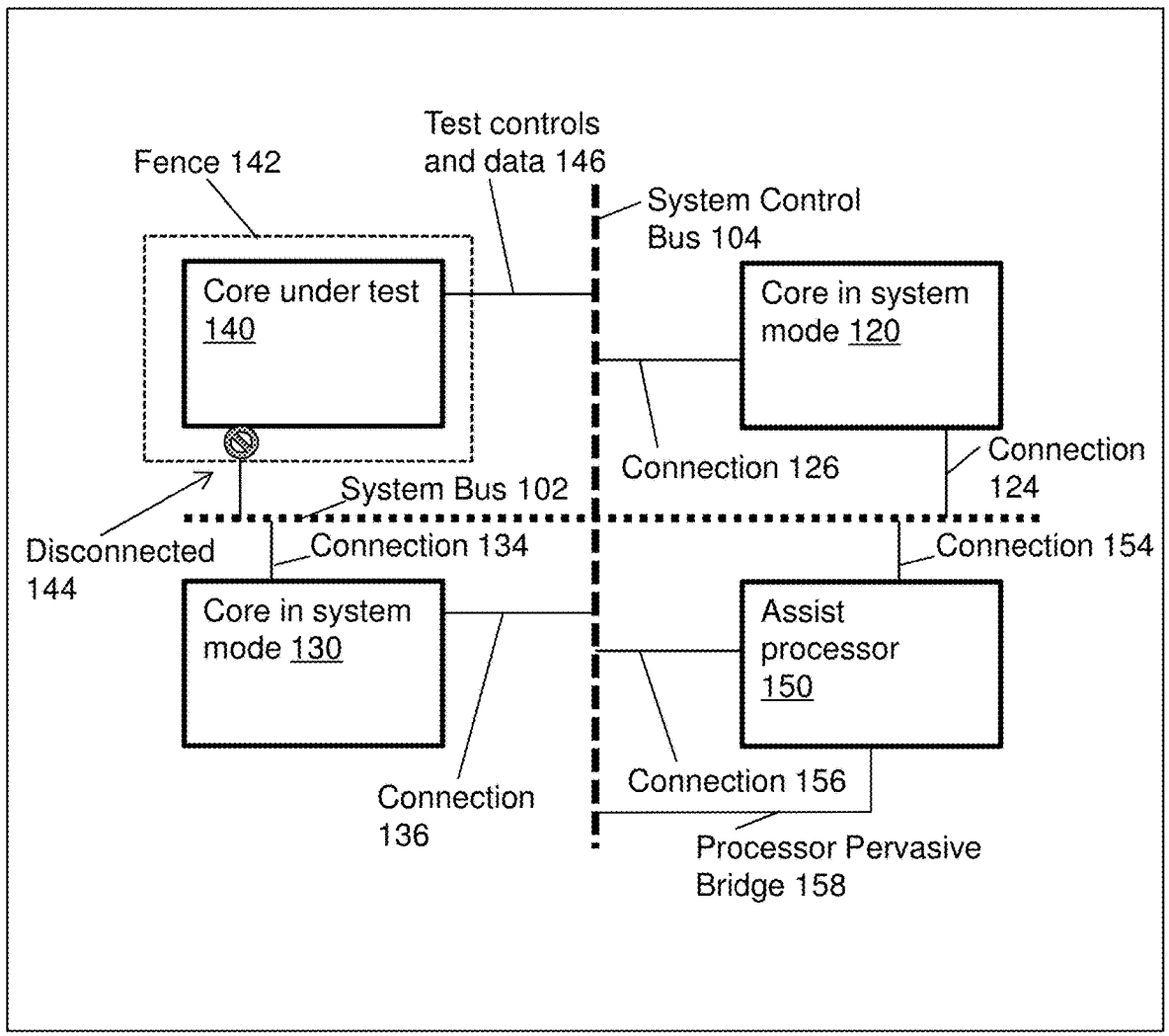
FIG. 1 depicts a system in accordance with one or more embodiments.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e., one, two, three, four, etc. The terms "a plurality" may be understood to include any integer number greater than or equal to two, i.e., two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, as discussed above, manufacturing testing is complemented by the BISTs at processor startups. Yet, the BISTs includes the side effects of higher power consumption and possible performance degradations for the processors. While smart scheduling of BISTs can minimize these side effects, presently there is a need to improve the BISTs.

Turning now to an overview of the aspects of the invention, one or more embodiments of the invention address the above-described shortcomings of the prior art by enabling extensive testing coverage utilizing test circuits and logic internal to a chipset during operation of the chipset.

In accordance with one or more embodiments, the chipset includes multiple processor cores, where one core is used as a recovery unit (RU) and another core is used as a self-boot engine (SBE). The chipset, according to the test logic, moves workloads away from RU, tests the RU thoroughly using the SBE, and moves the workloads back to the RU.

In accordance with one or more embodiments, the chipset can utilize the RU for better cooling and/or higher frequency of single cores; avoid moving workloads away from the RU and only use a core that has been cleared for cooling purposes; execute processor self-tests on slightly overheated cores to find errors that would only show up later if running real-life applications.

In accordance with one or more embodiments, the chipset can utilize a pair of spare cores (to execute, e.g., float operations and compare results), utilize a third core in millicode mode instead of the SBE, utilize a third core in a system mode with special access operations (e.g., test interface to internal registers), and avoid using the RU by using operating system mechanisms to move workloads.

The technical effect and benefits of the internal test circuits and logic of the chipset include higher test coverage than what is possible with a BIST (which is runtime restricted), transparency to system operations (e.g., using spares, power, and bandwidth, which are transparent to applications of the system), low additional hardware costs (as the RU and the SBE are present on the chipset), and easy error identification (e.g., even if long-running mainframe with high uptime degrades over time). Thus, embodiments described herein are necessarily rooted in the internal test circuits and logic of the chipset to perform proactive operations to overcome problems specifically arising in the realm of processor testing.

Turning now to FIG. 1, a system 100 is generally shown in accordance with an embodiment. The system 100 can be an electronic, computer framework comprising and/or employing any number and combination of computing hardware and software utilizing various communication technologies, as described herein. The system can be easily scalable, extensible, and modular, with the ability to change to different services or reconfigure some features independently of others.

The system 100 is an example of a chipset. The chipset can be a collection of hardware and integrated circuits that together form an electronic device such as a processor, a central processing unit, a computer motherboard, and/or mobile phone. The chipset can include a plurality of processor cores connected to a system bus 102 and a system control bus 104.

Each of the plurality of processor cores can be individual electronic circuitry within the chipset that carries out instructions of a computer program by performing arithmetic, logic, controlling, and input/output (I/O) operations specified by the instructions. The system bus 102 and the system control bus 104 are electronic communication bridges supporting electronic communications between the processor cores utilizing common protocols.

As shown in FIG. 1, the plurality of processor cores includes a core in system mode 120, which is connected to the system bus 102 by connection 124 and connected to the system control bus 104 by connection 126. The plurality of processor cores also includes a core in system mode 130, which is connected to the system bus 102 by connection 134 and connected to the system control bus 104 by connection 136.

Figure 3:
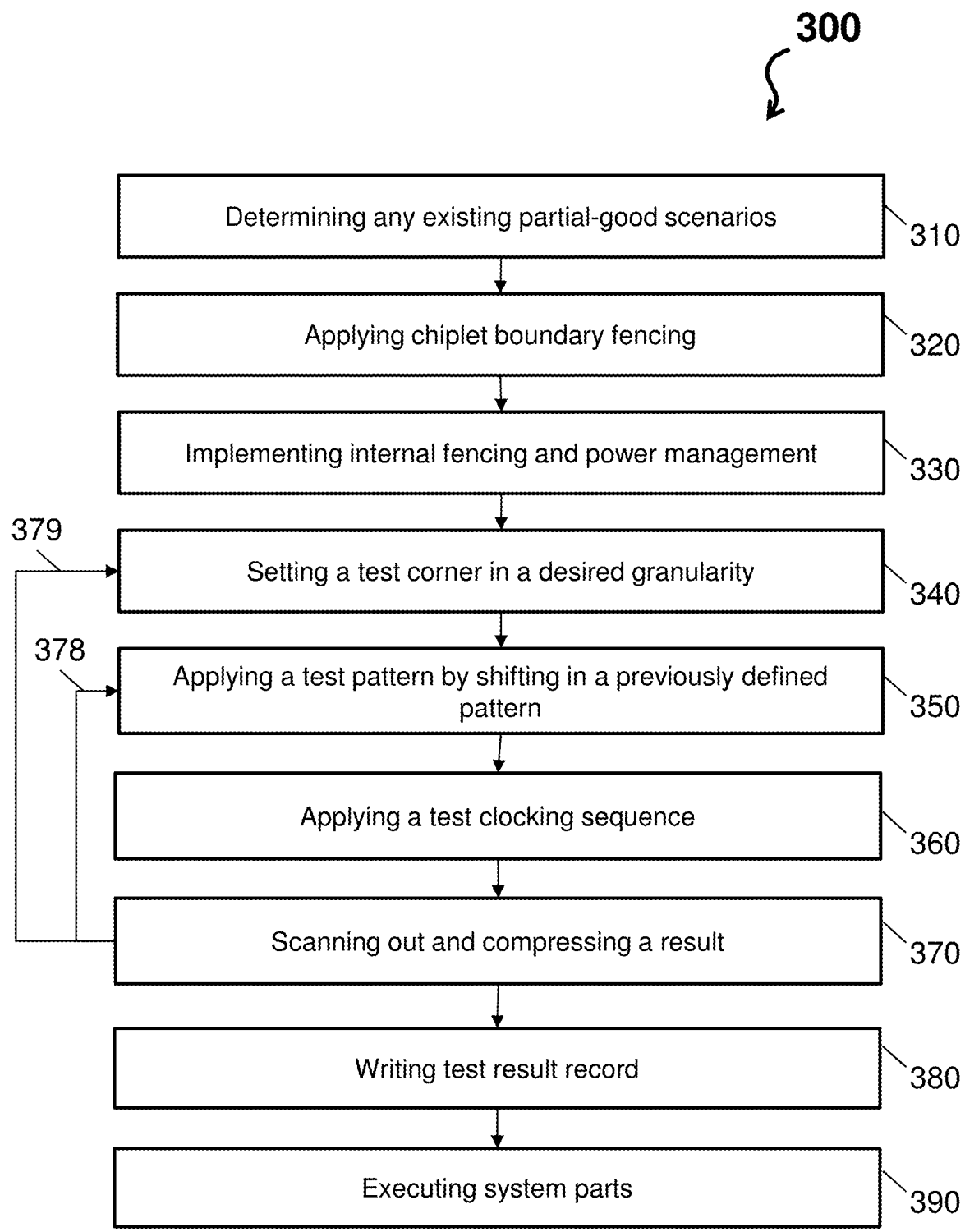
FIG. 3 depicts a process flow in accordance with one or more embodiments.
Figure 4:
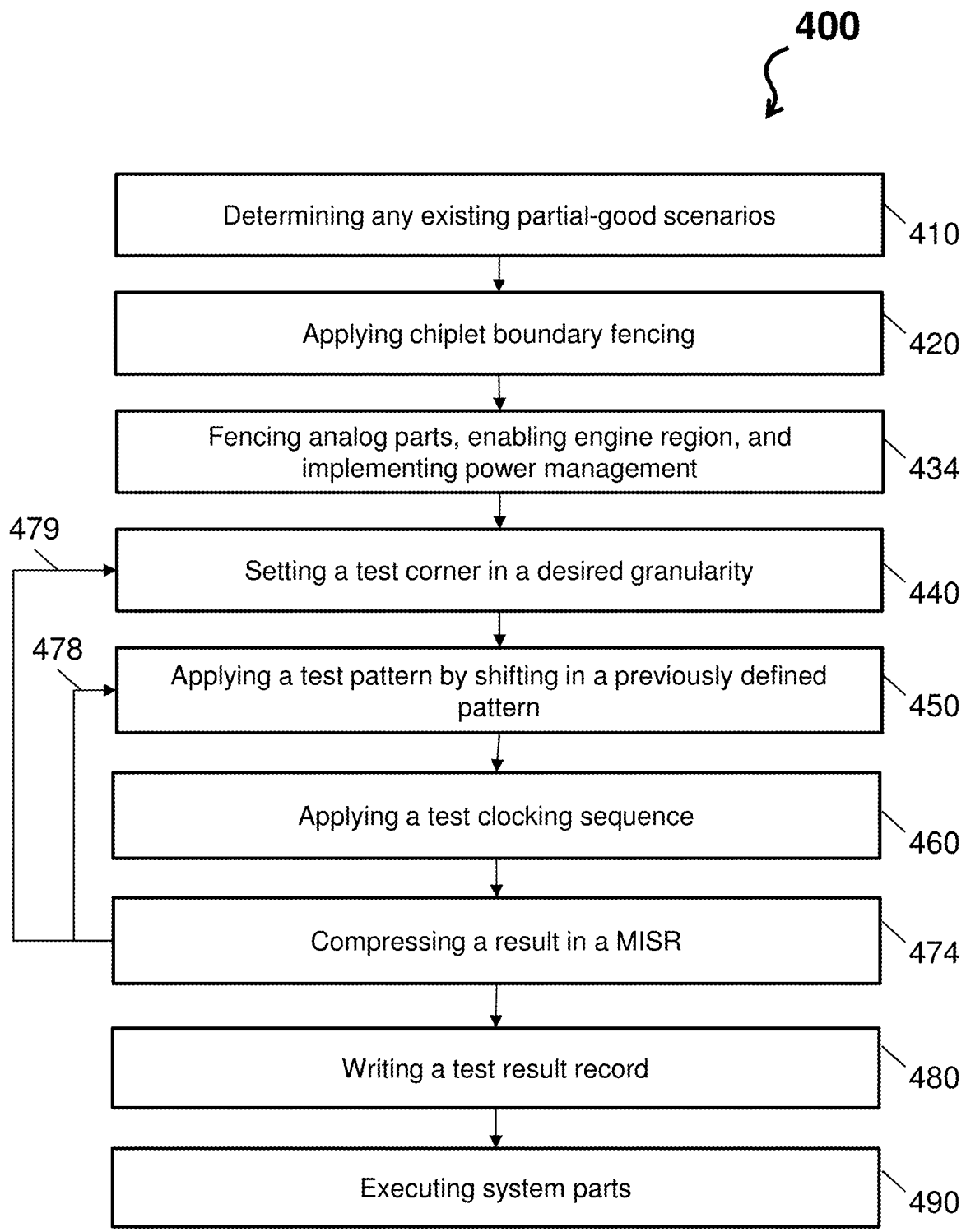
FIG. 4 depicts a process flow in accordance with one or more embodiments.
Figure 5:
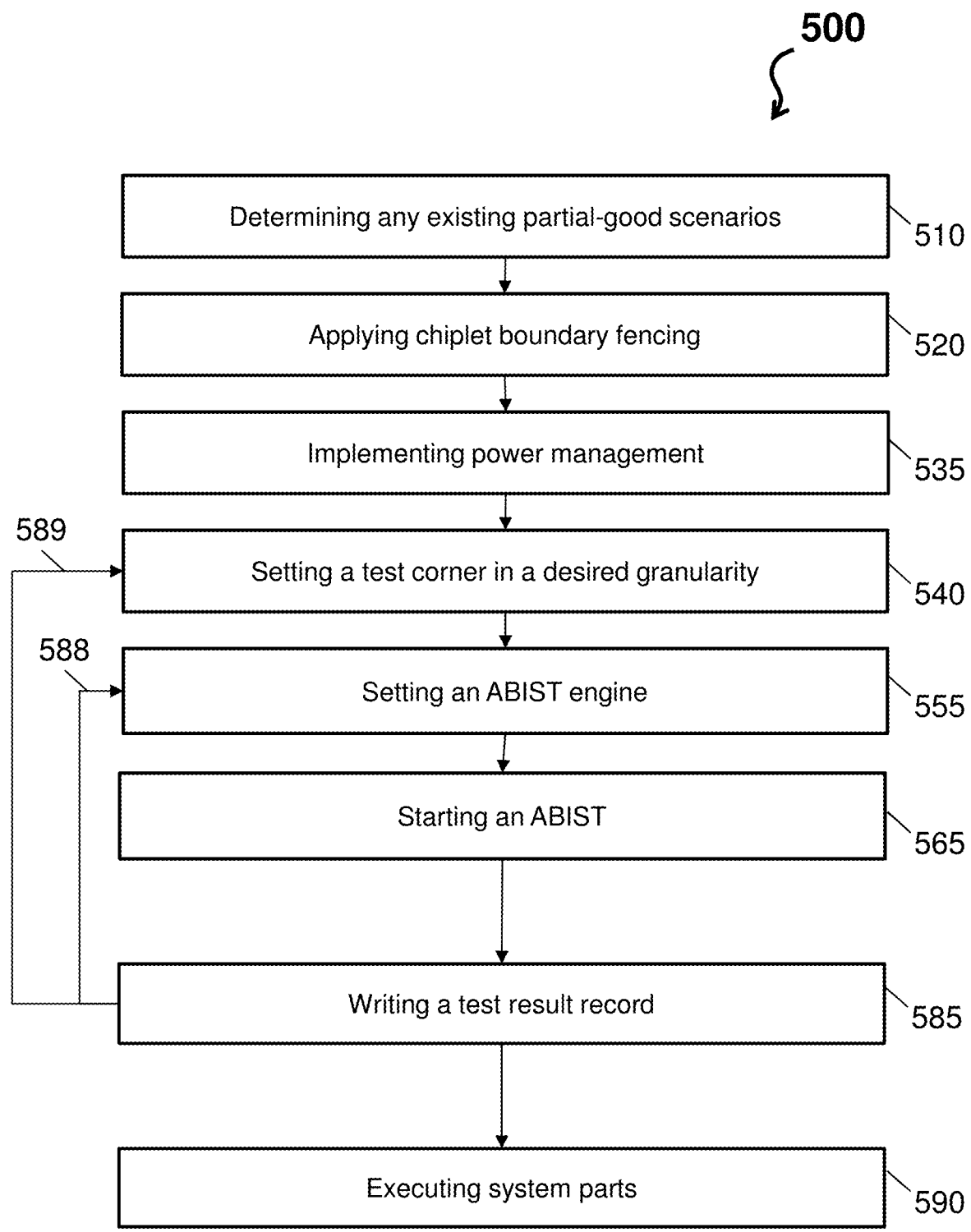
FIG. 5 depicts a process flow in accordance with one or more embodiments.

The plurality of processor cores also includes a core under test 140, which can be contained within a fence 142 from the system 100. In this regard, the core under test 140 is disconnected 144 from the system bus 102, while still be connected to the system control bus 104 to communication test controls and data 146. The plurality of processor cores can also include a helper core, also known as an assist processor 150, which is connected to the system bus 102 by connection 154 and connected to the system control bus 104 by connection 156. Further, the assist process 150 can communicate with the other processor cores via a processor pervasive bridge 158. By way of example, operations of the system 100 are described with respect to FIGS. 3-5 in accordance with one or more embodiments. More particularly, the process flows of FIGS. 3-5 are examples of continuous mutual extended processor self-tests by the system 100. The operations of the system 100 can be implemented by the firmware of the chipset (e.g., a basic input/output system or BIOS of the system 100 stored on a non-transitory memory thereon), along with logic and other runtime services executing across the plurality of processor cores.

Figure 2:
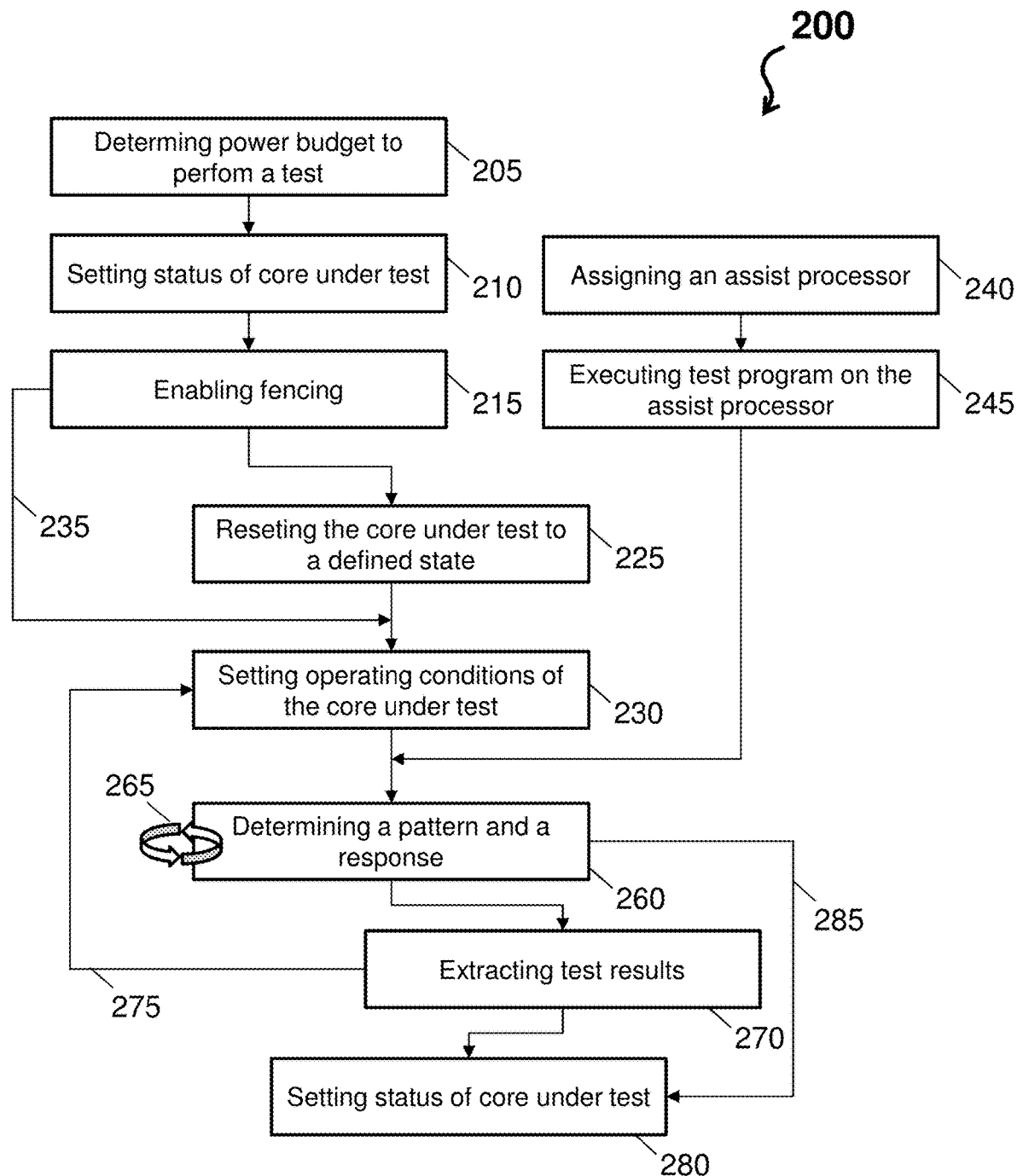
FIG. 2 depicts a process flow in accordance with one or more embodiments.

Turning now to FIG. 2, a process flow 200 is depicted in accordance with one or more embodiments. The process flow 200 begins at block 205, where the system 100 determines a power budget to perform a test. Each test t has a defined power budget P(t). If the current chip power consumption plus P(t) is less than a thermal design power (TDP), then the test can be executed. For instance, if the power budget is at a present value that allows the system 100 to perform a test (e.g., the continuous mutual extended processor self-test), the system 100 selects a core (or a next core) of the plurality of cores to be tested. Then, the system 100 moves a workload of this selected core to spare core or full core (e.g., the assist processor 150). Note that this core selection can be iterated over all cores to fully test the system 100.

At block 210, the system 100 sets a status of the selected core. This selected core can be the core under test 140, and thus the status is set to CoreUnderTest or CUT. In accordance with one or more embodiments, if a module of the chipset is selected, then the status is set to ModuleUnderTest (MUT).

At block 215, the system 100 enables fencing. More particularly, the system can enable a fence 142 around the core under test 140, which disconnects the core under test 140 from the system bus 102.

At block, 225, the system 100 resets the core under test 140 to a defined state. The defined state is equivalent to the status (e.g., CUT) set in block 210. The system 100 resets the core under test 140 after the workload have been moved so that the core under test 140 can begin testing from a fresh/new condition. Next, the process flow 200 proceeds to block 230. In accordance with one or more embodiment, the process flow 200 can alternatively proceed from block 215 directly to block 230 (e.g., as shown by the arrow 235). In this case, the core under test 140 does not need to be reset (for instance, there were no previous workloads to move). At block 230, the system 100 sets operating conditions of the core under test 140. The operating condition can include frequency, voltage, clock cycles, etc.

At block 240, the system 100 assigns an assist processor (e.g., the assist processor 150). Note that the operations of block 240 can occur at the same time as block 210. In this way, the system 100 can move the workload of the core under test 140 to the assist processor 150. At block 245, the system 100 executes a test program (e.g., the continuous mutual extended processor self-test) on the assist processor 150. In accordance with one or more embodiments, the test program can be selected according to a test sequence based on previous test results for the core under test 140.

At block 260, the system 100 determines a pattern and response. For example, the system 100 computes a next pattern/response, applies the pattern, and compares the response. The patterns applied here are a subset of the manufacturing test patterns and their respective golden test responses. An example includes a maximum frequency test (fmax), where the test would fail if the core under test is degraded. Note that the operations of block 260 can be repeated (as shown by arrows 265) until the test is finished, has failed, or until a spade core is needed. Note also that the operations of block 260 can be repeated in view of the test program executing on the assist processor 150 and the operating conditions of block 230.

At block 270, the system 100 extracts test results. The test results are extracted from the operations of block 260. As shown by arrow 275, the test results can be utilizeds by the system 100 to set the operation condition of block 230.

Next, the process flow 200 proceeds to block 280. At block 280, the system 100 sets the status of core under test 140. The status can be set to spare. In accordance with one or more embodiment, the process flow 200 can alternatively proceed from block 260 directly to block 280 (e.g., as shown by the arrow 285).

Turning now to FIG. 3, a process flow 300 is depicted in accordance with one or more embodiments. The process flow 300 is an example of a mutual self-test for a single core under test (e.g., the core under test 140) in a system mode, where a fence (e.g., fence 142) is used for test sequences for automatic test pattern generation (ATPG) type tests. Examples of ATPG type tests include a logic built-in self-test (LBIST), an ATPG itself, and an on product multiple input shift register (OPMISR).

At block 310, the system 100 determines whether any existing partial-good scenarios are present. In this regard, the system 100 can consider any existing partial-good scenario when setting fences, such that the system 100 can avoid enabling any known bad parts of the chipset.

At block 320, the system 100 applies a chiplet boundary fencing (e.g., fence 142). The chiplet boundary fencing can be applied on a receiving side to provide clock region fences for scan isolation within the chiplet (e.g., this defines the regions under test). Note that the pervasive region to the outside of the region under test is not fenced, as this is a test access path (see test controls and data 146 of FIG. 1). The system 100 can work from inner to outer, which implies logical fences and electrical fences on translator levels. The system 100 can inhibit system error propagation to standard RAS and stop functional clocks on selected regions of the core under test 140, while rest of the core/chip continues to run.

At block 330, the system 100 implements internal fencing and power management. The system 100 fences parts of the chip set with analog impact (e.g., thermal sensors) that are in the range of the test. The system 100 fences the arrays (e.g., non-combined LBIST). The system 100 considers power management features like clock gating/resonant clocking, as stated in a test specification (e.g., operating conditions from block 230 of FIG. 2).

At block 340, the system 100 sets a test corner in a desired granularity. For instance, the system 100 sets up the test corner within the fence 142, in the desired granularity, in the chiplet endpoint pervasive control registers. The test corner can be defined by a voltage, a frequency, and/or a clock mode.

At block 350, the system 100 applies a test pattern by shifting in a previously defined pattern. For example, the system 100 can apply the test pattern by shifting in the previously defined pattern to the scan chains/regions under test, set up on a product clock generator for test sequences. At block 360, the system 100 applies a test clocking sequence. With respect to an ATPG, a single clock can be used. With respect to LBIST and OPMISR, an on product clock generator (OPCG) engine can be started.

At block 370, the system 100 scans out and compresses a result. With respect to an ATPG, the system 100 can scan out the result with the existing chiplet clock controller. With respect to LBIST and OPMISR, the system 100 can compress the result in the multi input shift register (MISR, used to generate and store a test result signature). As shown by arrow 378, the process flow 300 can return to block 350 to apply the next pattern in the current corner. As shown by arrow 379, the process flow 300 can return to block 340 if remaining test corners exist.

At block 380, the system 100 writes a test result record. For example, the system 100 can compare the result, act accordingly (e.g., write the test result record about test status and result: test_failed), and update a partial good table if present (e.g., test_finished, spare_needed).

At block 390, the system 100 executes system parts. In accordance with one or more embodiments, the system 100 can run parts of a system initial machine load/initial program load system (IML, restart of the physical machine/IPL, restart of the logical partition including operating) for recreating a same state for the spare chiplet under test. For example, the system 100 can scan0/arrayinit the tested regions, drop vital fences, apply chiplet reset, start clocks; drop chiplet fence/boundary fence/region fence (work from outer to inner), check error registers; and re-enable power management for a desired power mode, re-enable error propagation, or set chiplet state to idle/spare.

FIG. 4 depicts a process flow 400 in accordance with one or more embodiments. The process flow 400 is an example of a mutual self-test for a single core under test (e.g., the core under test 140) in a system mode, where a fence (e.g., fence 142) is used for test sequences for combined LBIST type tests.

At block 410, the system 100 determines whether any existing partial-good scenarios are present. In this regard, the system 100 can consider any existing partial-good scenario when setting fences, such that the system 100 can avoid enabling any known bad parts of the chipset.

At block 420, the system 100 applies a chiplet boundary fencing (e.g., fence 142). The chiplet boundary fencing can be applied on a receiving side to provide clock region fences for scan isolation within the chiplet (e.g., this defines the regions under test). Note that the pervasive region to the outside of the region under test is not fenced, as this is a test access path (see test controls and data 146 of FIG. 1). The system 100 can work from inner to outer, which implies logical fences and electrical fences on translator levels. The system 100 can inhibit system error propagation to standard RAS and stop functional clocks on selected regions of the core under test 140, while rest of the core/chip continues to run.

At block 434, the system 100 implements a fencing of analog parts, enables an engine region and implements power management. The system 100 fences parts of the chipset with analog impact (e.g., thermal sensors) that are in the range of the test The system 100 enables an automatic built-in self-test (ABIST) engine region, for embedded dynamic random-access memory (eDRAM), to enable a refresh fence (e.g., combined LBIST). The system 100 considers power management features like clock gating/ resonant clocking, as stated in a test specification (e.g., operating conditions from block 230 of FIG. 2).

At block 440, the system 100 sets a test corner in the desired granularity. For instance, the system 100 sets up the test corner within the fence 142, in the desired granularity, in the chiplet endpoint pervasive control registers. The test corner can be defined by a voltage, a frequency, and/or a clock mode.

At block 450, the system 100 applies a test pattern by shifting in a previously defined pattern. For example, the system 100 can apply the test pattern by shifting in the previously defined pattern to the scan chains/regions under test, set up on a product clock generator for test sequences. At block 460, the system 100 applies a test clocking sequence.

At block 474, the system 100 compresses a result in a MISR. As shown by arrows 478 and 479, the process flow 300 can return to block 350 with respect to a next pattern or return to block 340 with respect to a next corner.

At block 480, the system 100 writes a test result record. For example, the system 100 can compare the result, act accordingly (e.g., write the test result record about test status and result: test_failed), and update a partial good table if present (e.g., test_finished, spare_needed)

At block 490, the system 100 executes system parts. In accordance with one or more embodiments, the system 100 can run parts of a system IML/IPL for recreating a same state for the spare chiplet under test. For example, the system 100 can scan0/arrayinit the tested regions, drop vital fences, apply chiplet reset, start clocks; drop chiplet fence/boundary fence/region fence (work from outer to inner), check error registers; and re-enable power management for a desired power mode, re-enable error propagation, or set chiplet state to idle/spare.

FIG. 5 depicts a process flow 500 in accordance with one or more embodiments. The process flow 500 is an example of a mutual self-test for a single core under test (e.g., the core under test 140) in a system mode, where a fence (e.g., fence 142) is used for test sequences for ABIST type tests.

At block 510, the system 100 determines whether any existing partial-good scenarios are present. In this regard, the system 100 can consider any existing partial-good scenario when setting fences, such that the system 100 can avoid enabling any known bad parts of the chipset.

At block 520, the system 100 applies a chiplet boundary fencing (e.g., fence 142). The chiplet boundary fencing can be applied on a receiving side to provide clock region fences for scan isolation within the chiplet (e.g., this defines the regions under test). Note that the pervasive region to the outside of the region under test is not fenced, as this is a test access path (see test controls and data 146 of FIG. 1). The system 100 can work from inner to outer, which implies logical fences and electrical fences on translator levels. The system 100 can inhibit system error propagation to standard RAS and stop functional clocks on selected regions of the core under test 140, while rest of the core/chip continues to run.

At block 535, at block 434, the system 100 implements power management. The system 100 considers power management features like clock gating/resonant clocking, as stated in a test specification (e.g., operating conditions from block 230 of FIG. 2).

At block 540, the system 100 sets a test corner in a desired granularity. For instance, the system 100 sets up the test corner within the fence 142, in the desired granularity, in the chiplet endpoint pervasive control registers. The test corner can be defined by a voltage, a frequency, and/or a clock mode.

At block 555, the system 100 sets an ABIST engine. The ABIST engine can be configured with respect to an ABIST sequence, a repair action, timing tweaks, runlength, etc., for an eDRAM that can enable a refresh fence. At block 565, the system 100 starts an ABIST.

At block 585, the system 100 writes a test result record. For example, the system 100 can compare the result, act accordingly (e.g., write the test result record about test status and result: test_failed), and update a partial good table if present (e.g., test_finished, spare_needed). As shown by arrows 588 and 589, the process flow 300 can return to block 350 with respect to a next pattern or return to block 340 with respect to a next corner.

At block 590, the system 100 executes system parts. In accordance with one or more embodiments, the system 100 can run parts of a system IML/IPL for recreating a same state for the spare chiplet under test. For example, the system 100 can scan0/arrayinit the tested regions, drop vital fences, apply chiplet reset, start clocks; drop chiplet fence/boundary fence/region fence (work from outer to inner), check error registers; and re-enable power management for a desired power mode, re-enable error propagation, or set chiplet state to idle/spare.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for a continuous mutual extended processor self-test by a system comprising a plurality of cores, the method comprising:
   determining a power budget to perform the continuous mutual extended processor self-test;
   selecting a core of the plurality of cores to be tested based on the power budget;
   setting a status of the selected core to CoreUnderTest to provide the core under test;
   setting, by the system, an operating condition for the continuous mutual extended processor self-test;
   enabling a fence around the core under test that disconnects the core under test from a system bus of the system;
   executing, by an assist processor of the plurality of cores, a test program that implements the continuous mutual extended processor self-test on the core under test of the plurality of cores;
   determining, by the system, a pattern and a response during the test program execution; and
   iteratively repeating, by the system, the test program until the test program has finished or failed, wherein the test program is updated with a new operating condition based on the pattern and response determined during the test program execution.

2. The method of claim 1, wherein the method further comprises:
extracting test results from the pattern and the response;
utilizing the test results to set the operation condition.

3. The method of claim 2, wherein repeating the test program comprises:
repeatedly executing by the assist processor the test program in view of the operating conditions being set according to the test results.

4. The method of claim 1, wherein the method further comprises:
selecting a core of the plurality of cores to be tested as the core under test.

5. The method of claim 1, wherein the method further comprises:
moving a workload of the core under test to spare core or full core; and
resetting the core under test after the workload is moved.

6. A system comprising a plurality of cores and a memory storing program instructions for a continuous mutual extended processor self-test, the program instructions executable to cause:
determining a power budget to perform the continuous mutual extended processor self-test;
selecting a core of the plurality of cores to be tested based on the power budget;
setting a status of the selected core to CoreUnderTest to provide the core under test;
setting, by the system, an operating condition for the continuous mutual extended processor self-test;
enabling a fence around the core under test that disconnects the core under test from a system bus of the system;
executing, by an assist processor of the plurality of cores, a test program that implements the continuous mutual extended processor self-test on the core under test of the plurality of cores;
determining, by the system, a pattern and a response during the test program execution; and
iteratively repeating, by the system, the test program until the test program has finished or failed, wherein the test program is updated with a new operating condition based on the pattern and response determined during the test program execution.

7. The system of claim 6, wherein the program instructions are further executable to cause:
extracting test results from the pattern and the response;
utilizing the test results to set the operation condition.

8. The system of claim 7, wherein repeating the test program comprises:
repeatedly executing by the assist processor the test program in view of the operating conditions being set according to the test results.

9. The system of claim 6, wherein the program instructions are further executable to cause:
selecting a core of the plurality of cores to be tested as the core under test.

10. The system of claim 6, wherein the program instructions are further executable to cause:
moving a workload of the core under test to spare core or full core; and
resetting the core under test after the workload is moved.

11. A computer program product for implementing a continuous mutual extended processor self-test, the computer program product comprising a computer readable storage medium having program instructions embodied therewith, the program instructions executable by a system comprising a plurality of cores and a memory to cause:
determining a power budget to perform the continuous mutual extended processor self-test;
selecting a core of the plurality of cores to be tested based on the power budget;
setting a status of the selected core to CoreUnderTest to provide the core under test;
setting, by the system, an operating condition for the continuous mutual extended processor self-test;
enabling a fence around the core under test that disconnects the core under test from a system bus of the system;
executing, by an assist processor of the plurality of cores, a test program that implements the continuous mutual extended processor self-test on the core under test of the plurality of cores;
determining, by the system, a pattern and a response during the test program execution; and
iteratively repeating, by the system, the test program until the test program has finished or failed, wherein the test program is updated with a new operating condition based on the pattern and response determined during the test program execution.

12. The computer program product of claim 11, wherein the program instructions are further executable by the system to cause:
extracting test results from the pattern and the response;
utilizing the test results to set the operation condition.

13. The computer program product of claim 12, wherein repeating the test program comprises:
repeatedly executing by the assist processor the test program in view of the operating conditions being set according to the test results.

14. The computer program product of claim 11, wherein the program instructions are further executable by the system to cause:
selecting a core of the plurality of cores to be tested as the core under test.

* * * * *